United States Patent
Kumar et al.

(10) Patent No.: US 10,217,743 B2
(45) Date of Patent: Feb. 26, 2019

(54) DETECTING PROCESS VARIATION OF MEMORY CELLS

(71) Applicant: ARM Limited, Cambridge (GB)

(72) Inventors: Akshay Kumar, New Delhi (IN); Saikat Kumar Banik, New Delhi (IN)

(73) Assignee: ARM Limited, Cambridge (GB)

(*) Notice: Subject to any disclaimer, the term of this patent is extended or adjusted under 35 U.S.C. 154(b) by 5 days.

(21) Appl. No.: 15/434,659

(22) Filed: Feb. 16, 2017

(65) Prior Publication Data
US 2018/0233193 A1   Aug. 16, 2018

(51) Int. Cl.
*G11C 11/00* (2006.01)
*H01L 27/092* (2006.01)
*G11C 29/00* (2006.01)
*G11C 5/02* (2006.01)
*G11C 11/417* (2006.01)

(52) U.S. Cl.
CPC .......... *H01L 27/0922* (2013.01); *G11C 29/00* (2013.01); *G11C 5/025* (2013.01); *G11C 11/417* (2013.01)

(58) Field of Classification Search
CPC . B64C 27/35; B64C 2027/8236; B64C 27/10; H01L 27/0922; G11C 29/00; G11C 5/025; G11C 11/417
USPC .......................................................... 365/156
See application file for complete search history.

(56) References Cited

U.S. PATENT DOCUMENTS

| | | | |
|---|---|---|---|
| 7,636,268 B1* | 12/2009 | Peng | G11C 7/02 365/154 |
| 2013/0135953 A1* | 5/2013 | Hirabayashi | G11C 29/50016 365/201 |
| 2014/0247652 A1* | 9/2014 | Jin | G05F 3/02 365/154 |

* cited by examiner

*Primary Examiner* — Tha-O H Bui
(74) *Attorney, Agent, or Firm* — Pramudji Law Group PLLC; Ari Pramudji

(57) ABSTRACT

Various implementations described herein are directed to an integrated circuit having a memory cell array disposed in a first area of the integrated circuit. The memory cell array may include memory cells with first transistors of multiple types. The integrated circuit may include a process sensor disposed in a second area of the integrated circuit that is different than the first area. The process sensor may include a process detector having second transistors of the multiple types that are separate from the first transistors. The second transistors of the process detector may be arranged for detecting process variation of the memory cells of the memory cell array.

20 Claims, 7 Drawing Sheets

400B

400C

DETECTING PROCESS VARIATION OF MEMORY CELLS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, an integrated circuit (IC) having components of a computing system provided on a single chip typically refers to system on a chip (SoC). The SoC is fabricated to include digital, analog, mixed-signal, and/or radio-frequency (RF) capability on a single chip substrate. SoC applications are useful for mobile electronic devices due to their low power consumption and minimal area impact in embedded systems.

In some applications, an SOC may include embedded memory, such as, e.g., static random access memory (SRAM). Due to a denser layout, SRAM may have a higher defect density than other logic circuits, and to improve operating functionality of SRAM, memory circuitry should be tested to evaluate process variation of memory cells.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations of sensing process variation for memory applications will now be described in greater detail herein with reference to FIGS. 1A-5.

Figure 1A:
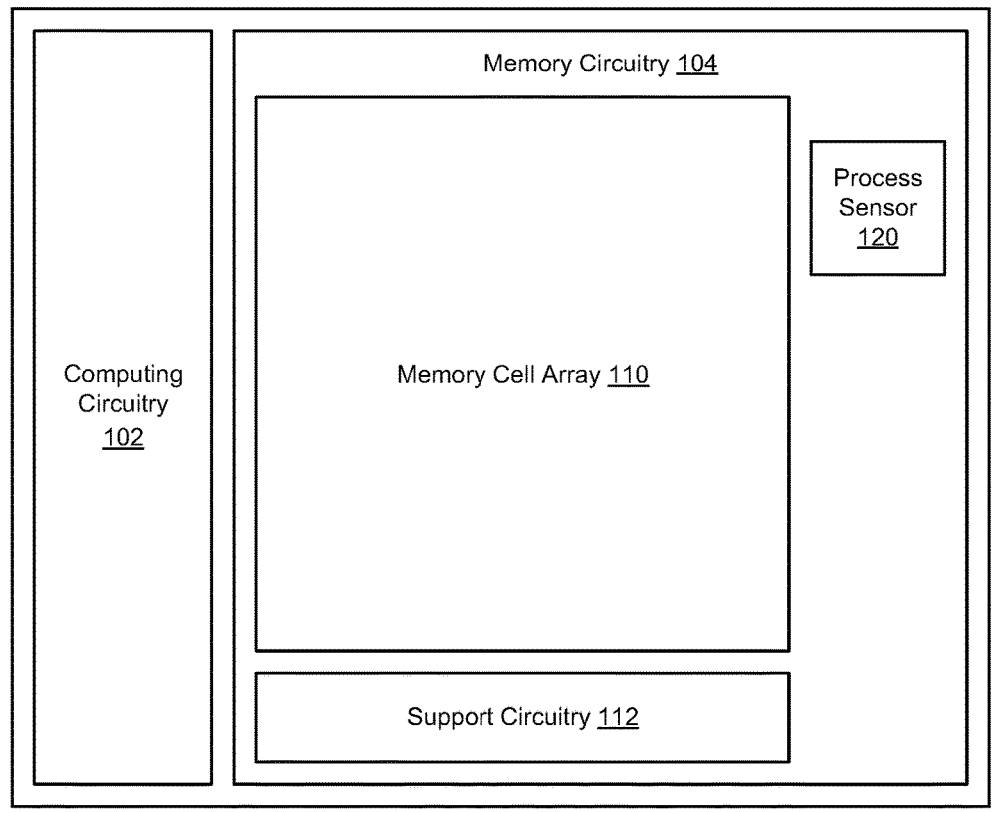
FIG. 1A illustrates a diagram of memory circuitry having a process sensor in accordance with various implementations described herein.
Figure 1B:
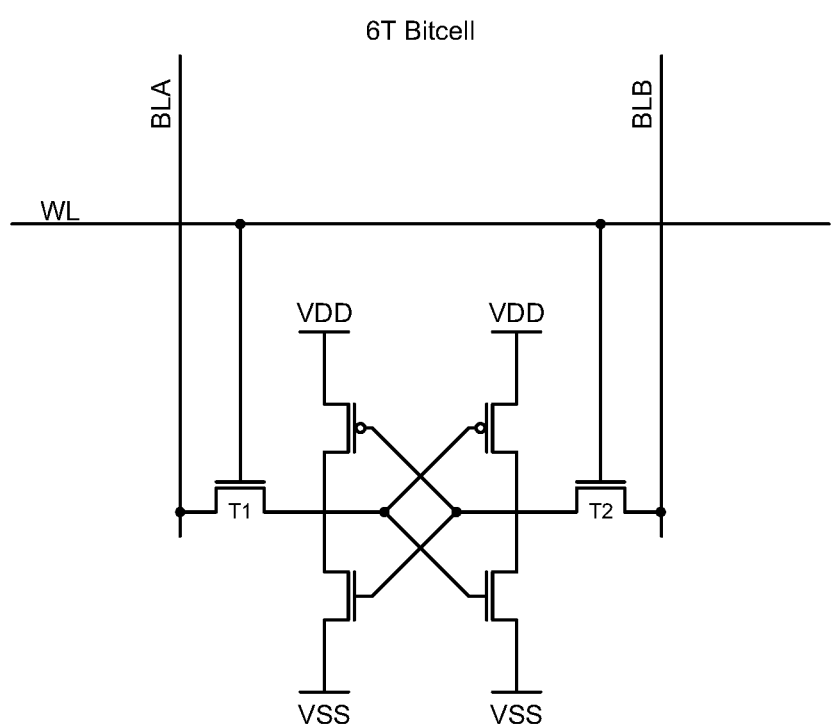
FIG. 1B illustrates a schematic diagram of memory cell circuitry in accordance with various implementations described herein.

FIGS. 1A-1B illustrate diagrams of memory circuitry utilized by a device 100 in accordance with various implementations described herein. In particular, FIG. 1A illustrates a block diagram 100A of memory circuitry 104 having a process sensor 120, and FIG. 1B illustrates a schematic diagram 100B of memory cell circuitry 130.

The device 100 may be implemented as a circuit, such as, e.g., an integrated circuit (IC) having computing circuitry 102 (including digital, analog, mixed-signal, and RF components), memory circuitry 104, (SRAM and/or other types of memory), and various other computer related components. In some implementations, the device 100 may be designed as an SoC that integrates the computing circuitry 102, the memory circuitry 104, and various other related components on a single chip. The device 100 may be used as an embedded system for various electronic and mobile applications. In some instances, the device 100 and components thereof may be implemented as a single chip.

In reference to FIG. 1A, the device 100 may include the memory circuitry 104 that utilizes at least one memory cell array 110 having a plurality of memory cells (e.g., the memory cell 130 of FIG. 1B) arranged in a two-dimensional (2D) array with rows and columns. The memory circuitry 104 may include support circuitry 112, such as, e.g., output multiplexing circuitry. The memory circuitry 104 may be implemented as a circuit, such as, e.g., an integrated circuit (IC), along with the computing circuitry 102, the memory cell array 110, the support circuitry 230, and the process sensor 120.

In some implementations, the memory cell array 110 may be disposed in a first area of the integrated circuit 100, and the memory cell array 110 may include a plurality of memory cells having first transistors of multiple types. The first memory cells may be referred to as a bitcell, and each memory cell may be configured to store at least one data bit value (e.g., related to storing logic 0 or 1). In some instances, the memory cells of the memory cell array 110 may be implemented with SRAM circuitry. Thus, in some of these cases, each memory cell may include a multi-transistor SRAM cell, including various types of SRAM cells, such as, e.g., 6T CMOS SRAM (as shown, e.g., in FIG. 1B) and/or other types of CMOS SRAM cells, such as, e.g., 4T, 8T, 10T or more transistors per bit. Thus, the memory cells may include SRAM cells, and the memory cell array 110 may include an SRAM cell array. However, various other types of memory may be used.

Figure 2:
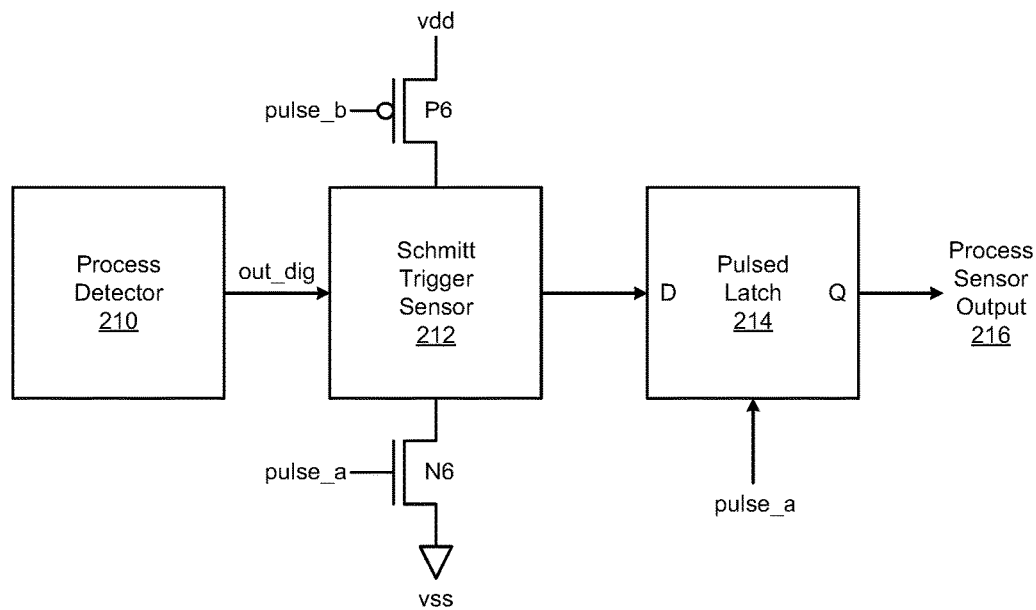
FIG. 2 illustrates a diagram of a process sensor in accordance with various implementations described herein.
Figure 2:
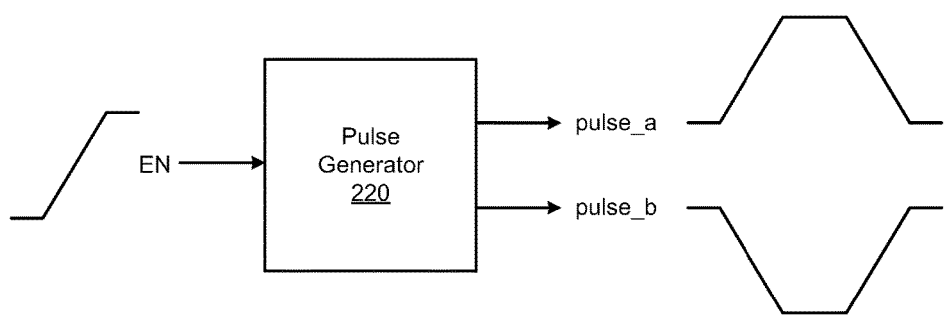
Figure 3:
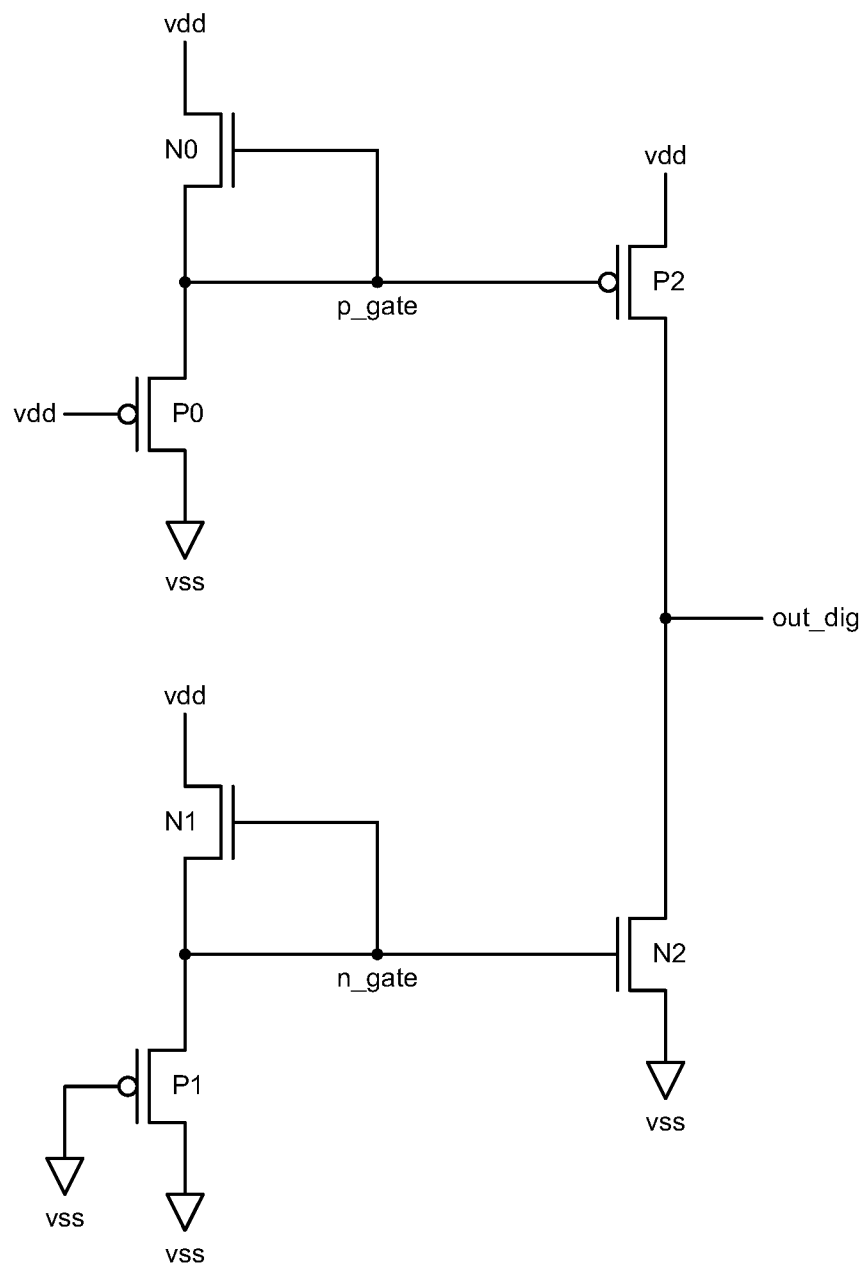
FIG. 3 illustrates a schematic diagram of a process detector in accordance with various implementations described herein.

As shown in FIG. 1A, the process sensor 120 may be disposed in a second area of the integrated circuit 100 that is different than the first area. As shown in FIGS. 2-3, the process sensor 120 may include a process detector 210 with second transistors of the multiple types (e.g., NMOS, PMOS) that are separate from the first transistors of the memory cell array 110. In some cases, the second area is manufactured on (or part of) a same wafer, i.e., a same integrated circuit, so that the process detector 210 detects (or senses) skew of the memory circuitry 104 on the same wafer.

As shown in FIG. 3, the second transistors of the process detector 210 may be arranged for detecting (or sensing) process variation of the memory cells of the memory cell array 110; i.e., the second transistors of the process detector 210 may be arranged for detecting process variation of the memory cell array 110 and the memory circuitry 104. In some instances, detecting process variation of the memory cells of the memory cell array 110 may include sensing process variation of the first transistors of the multiple types (e.g., NMOS, PMOS). As such, the multiple types may include N-type and P-type, and the first transistors may include N-type metal-oxide-semiconductor (NMOS) transistors and P-type MOS (PMOS) transistors. Further, the second transistors may include NMOS transistors and PMOS transistors formed along with the first transistors, wherein the second transistors may be formed (or fabricated) at a same manufacturing time when the first transistors are formed (or fabricated).

In some implementations, detecting (or sensing) process variation may include detecting global complementary metal-oxide-semiconductor (CMOS) process variation of the memory cells of the memory cell array 110. Further, detecting process variation may include detecting a process point when the second transistors detect that the process variation has skewed sufficiently to a SF process point. This naming convention of the process point refers to a first position and a second position for the process point. For instance, the SF process point refers to detecting, in a first position (S), slower N-type MOS transistors of the first transistors of an N-type of the multiple types and to detecting, in a second position (F), faster P-type MOS transistors of the first transistors of a P-type of the multiple types. In another instance, detecting process variation may also include detecting another process point when the second transistors detect that the process variation has skewed sufficiently to a FS process point. In this instance, the FS process point refers to detecting, in the first position (F), faster N-type MOS transistors of the first transistors of an N-type of the multiple types and to detecting, in the second position (S), slower P-type MOS transistors of the first transistors of a P-type of the multiple types. This convention of 'S' and 'F' may be used by foundries to model the effect of variations in the manufacturing of MOS transistors. At process corners where a particular transistor is slow (S), the threshold voltage (Vt) of the transistor may be modelled as higher than a typical Vt, to thereby include one or more or all manufacturing effects (variations) that may reduce the drain current of the transistor than what may be typically expected. At process corners where a particular transistor is fast (F), the threshold voltage (Vt) of the transistor may be modelled as lower than a typical Vt, to thereby include one or more or all manufacturing effects (variations) that may increase the drain current of the transistor to a value higher than what may be typically expected.

Due to dense layout, the memory cell array 110 may have a high defect density than other logic circuits of the device 100. Therefore, to evaluate yield of the memory cell array 110, the process sensor 120 may be utilized to detect and analyze process variation of the memory cells of the memory cell array 110. For instance, the process sensor 120 may be provide circuitry that provides a control signal, e.g., a digital 1-bit output signal, when the circuitry detects that a global CMOS process has skewed sufficiently to a SF (slower NMOS/faster PMOS) process point. In some instances, FS (faster NMOS/slower PMOS) process point detection may also be utilized with similar topology. Thus, a skewed process sensor IC topology may be provided for embedding in memory circuitry, such as, e.g., SRAM, that may enhance power, performance, and area (PPA) of memories.

In SRAM design, write operations may be somewhat worse at the SF process point, due to pull-up transistors being stronger than pass-gates. Thus, SRAM design may be developed to qualify the SF process point in margining. An outcome of this may refer to a situation where the SS process point may have over-designed memory with more write margin than may be needed. This outcome may negatively impact PPA of memory circuitry at the SS process point. Therefore, if detecting when a manufactured memory instance is at the global SF process point is achieved, then this detection may be extended to a write pulse only in such instances. For other instances, write operations may be performed with shorter pulses, which may thus significantly improve performance and dynamic power in the memory circuitry. As shown in FIG. 2, such a process sensor is provided, and as shown in FIG. 3, such a process detector is provided to achieve the various implementations as provided herein.

FIG. 1B illustrates a schematic diagram of a memory cell 100B in accordance with implementations described herein. Generally, there are two types of structures: one-wordline devices and multi-wordline devices. One wordline devices (e.g., ROM, DRAM, SRAM) refer to a devices having only one access port, which may be referred to as access devices. The bitlines may be single rail or dual rail. The transistor types (e.g., NMOS and PMOS) may be referred to as access transistors.

As shown in FIG. 1B, static RAM bitcells may include a 6T bitcell, which may have access ports controlled by wordlines. In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Therefore, although these multi-ports transistor types may vary within each bitcell, there may also be a need to have a variation between arrays as in type one, like a left half array and a right half array.

FIG. 2 illustrates a diagram 200 of the process sensor 120 in accordance with various implementations described herein.

As shown in FIG. 2, the process sensor 120 may include the process detector 210, a Schmitt trigger sensor 212, and a pulsed latch 214. Further, the process sensor 120 may also include a pulse generator 220 that receives an enable signal (EN) that is provided with a rising edge, and the pulse generator 220 may provide output signals, such as, e.g., a first output pulse signal (pulse_a) and a second output pulse signal (pulse_b) that is complementary to the first output pulse signal (pulse_a).

The process detector 210 may provide a 1-bit digital output signal (out_dig) to the Schmitt trigger sensor 212. As shown, the Schmitt trigger sensor 212 may receive a signal from a PMOS transistor P6 that is activated with the second output pulse signal (pulse_b). For instance, when pulse_b goes low, the PMOS transistor P6 may be activated and may provide a power coupling to the Schmitt trigger sensor 212. Further, the Schmitt trigger sensor 212 may receive another signal from an NMOS transistor N6 that is activated with the first output pulse signal (pulse_a). In this instance, the PMOS transistor P6 and the NMOS transistor N6 may constitute power gates that are off (e.g., not activated, thus cutting power supply to the Schmitt trigger sensor 212), and transistors P6, N6 may turn on (or be activated) when pulse_a and pulse_b are received. Thus, pulse_a and pulse_b may be implemented as control signals. Based on receiving these signals, the Schmitt trigger sensor 212 may provide an output signal to the D input of the pulsed latch 214. As shown, the pulsed latch 214 receives the output signal from the Schmitt trigger sensor 212 and further receives the first output pulse signal (pulse_a). Based on receiving these signals, the pulsed latch 214 may provide a process sensor output signal 216 via a Q output thereof.

FIG. 3 illustrates a schematic diagram and topology of the process detector 210 in accordance with various implementations described herein. In some instances, the process detector 210 may be referred to as an SF process detector circuit.

As shown in FIG. 3, the process detector 210 may include NMOS transistors N0, N1, N2 (e.g., NFET devices) and PMOS transistors P0, P1, P2 (e.g., PFET devices) that are coupled to voltage sources (e.g., VDD, VSS) and are arranged to provide a digital 1-bit output (out_dig) when the NMOS and PMOS transistors detect (or sense) process variation of components of the integrated circuit 100, such as, e.g., memory cells of the memory cell array 110. In some instances, the first source voltage VDD may refer to an operating voltage of greater than 0 volts, and the second source voltage VSS may refer to a ground voltage (GND) of 0 volts. Further, the NMOS transistor N2 may be larger and stronger than the PMOS transistor P2.

In some instances, a nominal value for the output node (out_dig) may be less than VDD/2. It may be only at the SF process point that this node should rise above VDD/2. In some cases, the integrated circuit 100 may be implemented with a FinFET process. In some other cases, this topology may also be implemented in a planar (bulk) process. The sizes may be tuned for a particular technology, and a sizing parameter may refer to an instance where the NMOS transistor N2 is much stronger than the PMOS transistor P2.

In reference to the topology of FIG. 3, and in reference to TT (typical/typical)/SS (slower/slower)/FF (faster/faster) process corners, one or more of the following may be provided. (1) The NFET N0 may try to pull node p_gate to VDD, but is counter-acted by leakage from PMOS P0. Thus, node p_gate may settle to some voltage V1. (2) The PFET P1 may try to pull node n_gate to VSS, but is counter-acted by leakage from NMOS N1. Thus, node n_gate may settle to some voltage V2. (3) The sizing of transistors P0, N0, P1, and N1 may be provided so that voltage (VDD–V1) is less than V2 at the TT, SS, and FF process corners. Thus, in some cases, the PFET P2 may see a smaller overdrive than the NFET N2. Further, since NFET N2 may be much wider than PFET P2, the output (out_dig) may stay below VDD/2.

In reference to FS (faster/slower) process corner, one or more of the following may be provided. (1) The NFET N0 may try to pull node p_gate to VDD, but is counter-acted by leakage from PMOS P0. However, at the FS process corner, the NFET N0 may be much stronger than the PMOS P0, and hence V1 may be close to VDD. (2) The PFET P1 may try to pull node n_gate to VSS, but is counter-acted by leakage from NMOS N1. However, at the FS process corner, the NFET N0 is much stronger than the PMOS P0, and hence, V2 may be larger than at the TT/SS/FF points. (3) Since NFET N2 may be wider than PFET P2, NFET N2 may see a larger overdrive, and since the process may be N-fast, P-slow, the output (out_dig) may stay well below VDD/2.

In reference to SF (slower/faster) process corner, one or more of the following may be provided. (1) The NFET N0 may try to pull node p_gate to VDD, but is counter-acted by leakage from PMOS P0. However, at the SF process corner, the PFET P0 may be stronger than the NFET N0, and hence V1 may be lower than VDD by a magnitude larger than at the TT/SS/FF points. (2) The PFET P1 may try to pull node n_gate to VSS, but is counter-acted by leakage from NMOS N1. However, at the SF process corner, the PFET P0 may be stronger than the NFET N0, and hence V2 may be close to VSS. (3) Even though NFET N2 is larger than PFET P2, since NFET N2 may see a much lesser gate overdrive, and since the process is skewed N-slow, P-fast, the output (out_dig) may rise to a level above VDD/2.

As shown in FIG. 2, to convert the output signal (out_dig) to a digital signal, the Schmitt trigger sensor 212 and the pulsed latch 214 may be serially cascaded to the output of the process detector 210. When the enable signal (EN) that is provided to the pulse generator 220 goes through a positive transition (e.g., with rising edge), the Schmitt trigger sensor 212 may be enabled, and the pulsed latch 214 may then be momentarily pulsed into a transparent state. During this pulse (which may be tuned using simulations), the output of the pulsed latch 214 may store the process state. If the output of the pulsed latch 214 is 0 (i.e., logic 0), then the instance has not been manufactured at the global SF process corner. If the output of the pulsed latch 214 is 1 (e.g., logic 1), then the instance has been manufactured at the global SF process corner. In some cases, the EN signal may be effectively a power-gate enable signal for the Schmitt trigger sensor 212 (so that it does not consume power in the steady state), and the EN signal may also be used to provide the pulsed enable signal (e.g., pulse_a) for the pulsed latch 214. Sometimes, the EN signal may be a power-gate enable signal for all cases.

An alternative embodiment of the same topology may be utilized in an FS process sensor, which may be achieved by re-sizing the NMOS and PMOS transistors in the process detector 210. Such a process sensor may be useful to improve an access disturb margin (ADM) or read margin of memory circuitry, such as, e.g., SRAM. For instance, by making the NFET N2 weaker than the PFET P2, an FS process sensor may be designed in a similar manner. Thus, both types of skewed processes may be detected (or sensed) using this process sensor topology. When this relative sizing is achieved, one or more of the following may be provided. (1) At TT/SS/FF corners, since PFET P2 is stronger than NFET N2, the output out_dig may rest above VDD/2. (2) At the SF process corner, since the PFET P2 is stronger than the NFET N2 and may see more overdrive, the output (out_dig) may stay above VDD/2. (3) At the FS process corner, even though the PFET P2 is stronger than the NFET N2, the PFET P2 may see a significantly lesser overdrive, and the output (out_dig) may stay below VDD/2. In some cases, such a process sensor may be useful to improve the ADM of memory circuitry, such as, e.g., SRAM.

Figure 4A:
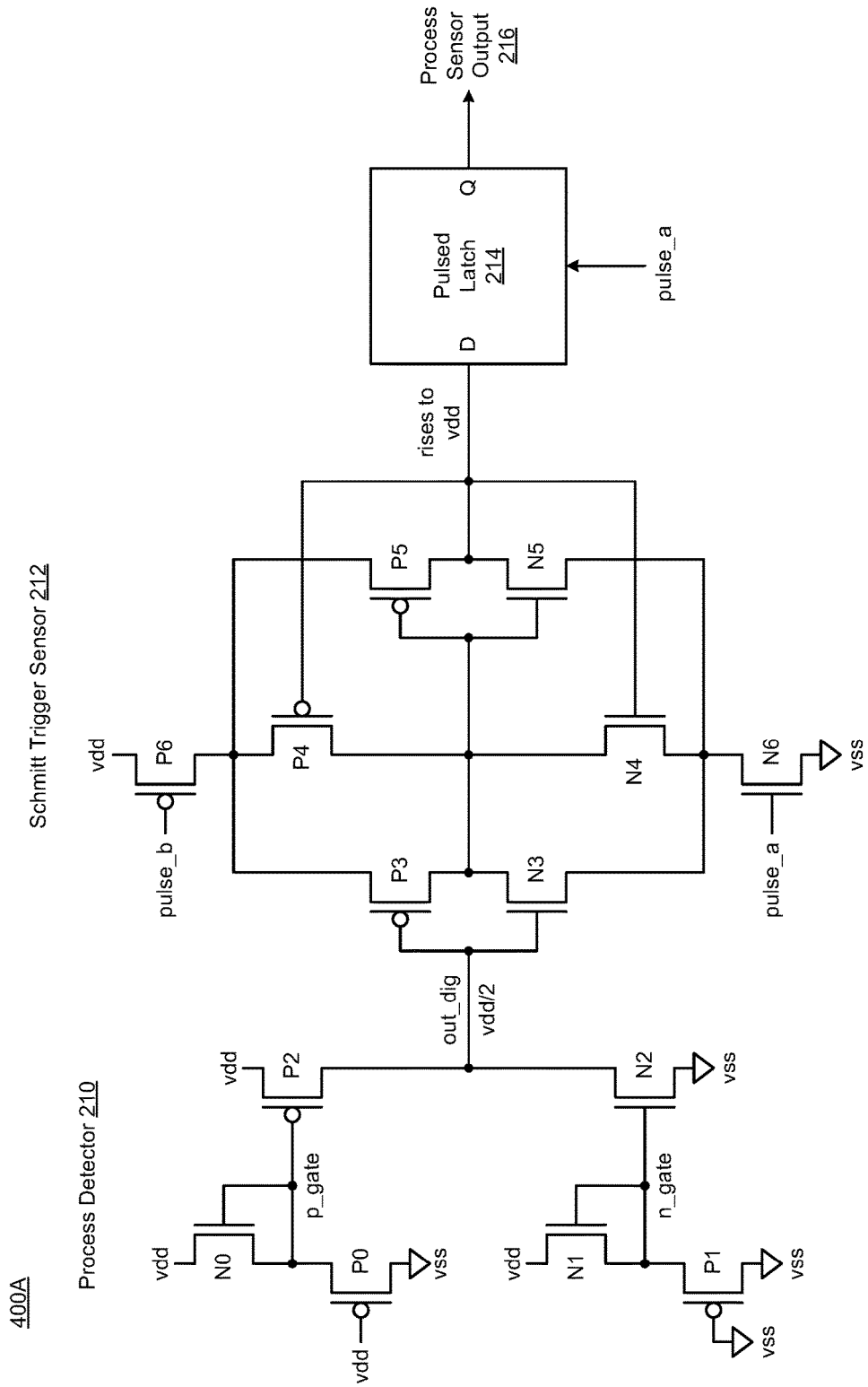
FIGS. 4A-4C illustrate various schematic diagrams of process sensor circuitry in accordance with various implementations described herein.
Figure 4B:
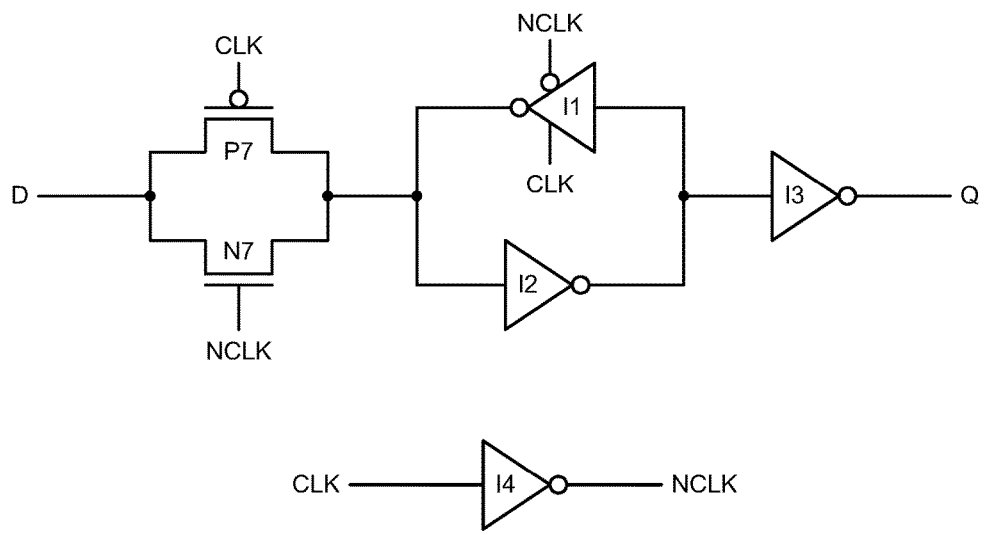
Figure 4C:
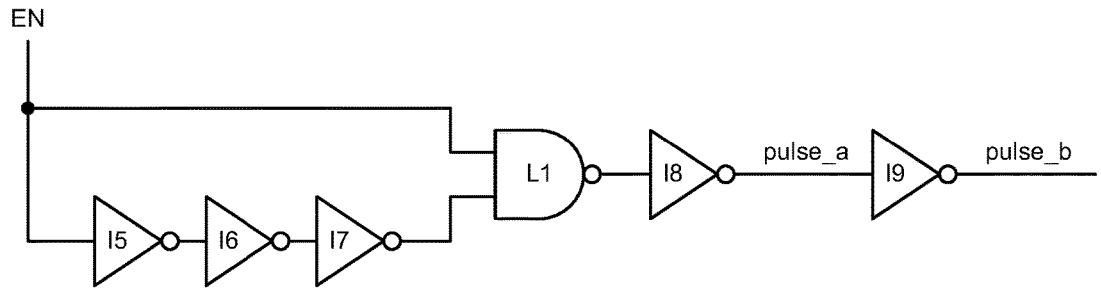

FIGS. 4A-4C illustrate various schematic diagrams of the process sensor 120 in accordance with implementations described herein. In particular, FIG. 4A illustrates a diagram 400A of the process detector 210 and the Schmitt trigger sensor 212 along with the pulsed latch 214, FIG. 4B illustrates a diagram 400B of the pulsed latch 214, and FIG. 4C shows a diagram of the pulse generator 220.

In FIG. 4A, the schematic diagram of the process detector 210 is provided, e.g., as shown in FIG. 3. As further shown in FIG. 4A, the Schmitt trigger sensor 212 may include NMOS transistors N3, N4, N5 and PMOS transistors P3, P4, P5 may be arranged to receive the output signal (out_dig) from the process detector 210, receive the source voltages VDD, VSS, and receive the pulse signal (pulse_a, pulse_b). Based on receiving these signals, the Schmitt trigger sensor 212 may provide an output signal (that rises to VDD) to the pulsed latch 214.

As shown in FIG. 4B, the pulsed latch 214 may include an NMOS transistor N7 that receives a not-clock signal NCLK and a PMOS transistor P7 that receives a clock signal CLK. The pulsed latch 214 may include multiple inverters I1, I2, I3. The transistors N7, P7 and the inverters I1, I2, I3 are arranged to receive an input signal from the Schmitt trigger sensor 212 via the D input and provide an output signal via the Q output. Further, the NCLK signal may be generated with another transistor I4 that receives the CLK signal, inverts the CLK signal, and provides the NCLK signal.

As shown in FIG. 4C, the pulse generator 220 may include a NAND gate L1 and multiple inverters I5, I6, I7, I8, I9 that are arranged to receive the enable signal EN as an input and provide the first output pulse signal (pulse_a) and the second output pulse signal (pulse_b). As shown, the first output pulse signal (pulse_a) may be provided at an output of the inverter I8, and the second output pulse signal (pulse_b) may be provided at an output of the inverter I9 as an inversion of pulse_a signal.

The circuitry of FIGS. 4A-4C may be integrated into various types of memory circuitry (e.g., SRAM). As shown, the circuits may utilize an additional pin enable (EN) on which a positive transition may occur during power-up. This may be used at power-down, because the pulsed latch 214 may lose a previously stored state, so the state should be refreshed at power-up. The circuits may operate from a single power supply (e.g., VDD), which may be VDDPE (e.g., periphery source voltage). Some power considerations may include one or more of the following. When the enable signal EN is not enabled, power gates may be enabled, and the circuits may consume less static power. In some cases, a static leakage path may be from the PFET P2 to the NFET N2, but their overdrives may be in the sub-threshold region, and the power consumption may be in nW (nano-watts) for some process corners. In some cases, a maximum static current may be observed at 1.7 uA. Thus, the circuits may consume low static power. Dynamic currents may rise up to a few 100 uA, but they may occur for times <50-100 ps, and as such, these dynamic currents may occur during power-up. Thus, these dynamic currents may be absorbed in a power-up transient and may occur for short periods. The circuits may further provide little or no issues during power-up, since the circuits may be refreshed after each power-up. Further, the circuits may be immune to power-down issues, because once the pulsed latch is set, no further operation may occur until a next power-up.

Figure 5:
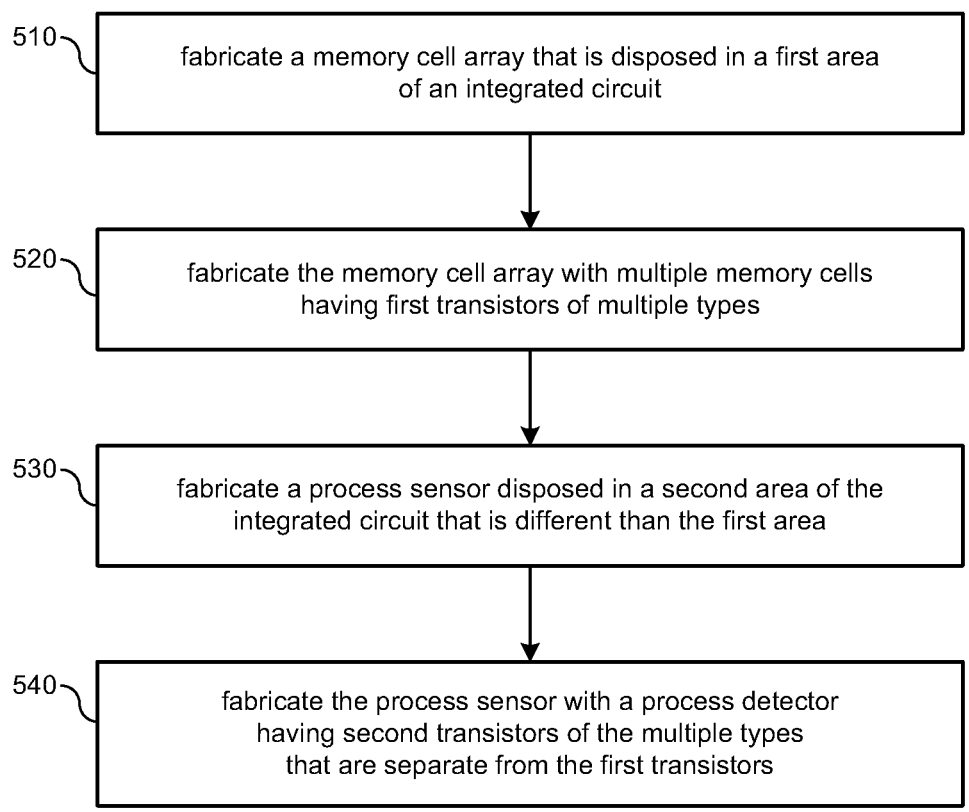
FIG. 5 illustrates a process flow of a method for sensing process variation in memory applications in accordance with various implementations described herein.

FIG. 5 illustrates a process flow of a method 500 for sensing process variation in memory applications in accordance with various implementations described herein. It should be understood that even though method 500 may indicate a particular order of operation execution, in some instances, various certain portions of the operations may be executed in a different order, and on different systems. In some instances, additional operations or steps may be added to and/or omitted from method 500. The method 500 may be implemented in hardware and/or software. If implemented in hardware, the method 500 may be implemented with various circuit components, such as described herein above in reference to FIGS. 1A-4C. If implemented in software, the method 500 may be implemented as a program or software instruction process that may be configured for sensing process variation as described herein. If implemented in software, instructions related to implementing the method 500 may be stored in memory and/or a database. For instance, a computer or various other computing devices having a processor and memory may be configured to perform method 500.

In reference to FIG. 5, method 500 may provide for sensing process variation in various memory applications. At block 510, method 500 may fabricate a memory cell array that is disposed in a first area of an integrated circuit. At block 520, method 500 may fabricate the memory cell array with multiple memory cells having first transistors of multiple types (e.g., complementary types). At block 530, method 500 may fabricate a process sensor disposed in a second area of the integrated circuit that is different than the first area. At block 540, method 500 may fabricate the process sensor with a process detector having second transistors of the multiple types (e.g., complementary types) that are separate from the first transistors.

The multiple types may include, e.g., multiple complementary types including N-type for NMOS transistors (e.g., NFET devices) and P-type for PMOS transistors (e.g., PFET devices). The second transistors may be fabricated (or formed) at the same manufacturing time when the first transistors are fabricated (or formed). The process detector may generate a digital 1-bit output when the second transistors detect process variation of the first transistors. Detecting process variation may include detecting (or sensing) a process point when the second transistors detect (or sense) that the process variation has skewed sufficiently (or substantially) to a SF process point. The SF process point may refer to detecting (or sensing) slower N-type transistors of the first transistors of the N-type and to detecting (or sensing) faster P-type transistors of the first transistors of the P-type. Detecting process variation may include detecting (or sensing) a process point when the second transistors detect (or sense) that the process variation has skewed sufficiently (or substantially) to a FS process point. The FS process point may refer to detecting (or sensing) faster N-type transistors of the first transistors of the N-type and to detecting (or sensing) slower P-type transistors of the first transistors of the P-type. As described herein, the memory circuitry may be implemented with SRAM circuitry, and the plurality of memory cells may include SRAM cells.

Described herein are implementations of an integrated circuit having a memory cell array disposed in a first area of the integrated circuit. The memory cell array may include memory cells with first transistors of multiple types. The integrated circuit may include a process sensor disposed in a second area of the integrated circuit that is different than the first area. The process sensor may include a process detector with second transistors of the multiple types that are separate from the first transistors. The second transistors of the process detector may be arranged for detecting process variation of the memory cells of the memory cell array.

Described herein are implementations of a device having memory circuitry with a plurality of memory cells that are implemented with first transistors of an N-type and a P-type. The device may include process sensing circuitry having a process detector that is implemented with second transistors of the N-type and the P-type. The second transistors of the process detector may be arranged for detecting process variation of the first transistors.

Described herein are implementations of a method. The method may include fabricating memory circuitry with a plurality of memory cells that are implemented with first transistors of complementary types. The method may include fabricating process sensing circuitry with a process detector that is implemented with second transistors of the complementary types. The second transistors of the process detector may be arranged for detecting process variation of the first transistors.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    a memory cell array disposed in a first area of the integrated circuit, the memory cell array having memory cells with first transistors of multiple types; and
    a process sensor disposed in a second area of the integrated circuit that is different than the first area, the process sensor having a process detector with second transistors of the multiple types that are separate from the first transistors,
    wherein the second transistors of the process detector are arranged for detecting process variation of the memory cells of the memory cell array based at least in part on detecting a process point of the memory cells skewing to a process corner of one or more process corners.

2. The integrated circuit of claim 1, wherein detecting process variation of the memory cells of the memory cell array includes sensing process variation of the first transistors of the multiple types.

3. The integrated circuit of claim 1, wherein the multiple types include N-type and P-type, and wherein the first transistors include N-type metal-oxide-semiconductor (NMOS) transistors and P-type MOS (PMOS) transistors.

4. The integrated circuit of claim 3, wherein the second transistors include NMOS transistors and PMOS transistors formed along with the first transistors.

5. The integrated circuit of claim 1, wherein the process detector is configured to:
    provide a digital 1-bit output when the second transistors detect process variation of the memory cells of the memory cell array; and
    change a write pulse of a write operation associated with at least one memory cell of the memory cells based at least in part on the digital 1-bit output and detecting the process point of the memory cells skewing to the process corner of one or more process corners.

6. The integrated circuit of claim 1, wherein detecting process variation includes detecting global complementary metal-oxide-semiconductor (CMOS) process variation of the memory cells of the memory cell array.

7. The integrated circuit of claim 1, wherein detecting process variation comprises detecting a process point when the second transistors detect that process variation has skewed sufficiently to a slower/faster (SF) process corner of the one or more process corners.

8. The integrated circuit of claim 7, wherein the SF process corner refers to slower N-type metal-oxide-semiconductor (NMOS) transistors of the first transistors and to faster P-type MOS (PMOS) transistors of the first transistors.

9. The integrated circuit of claim 1, wherein detecting process variation comprises detecting a process point when the second transistors detect that process variation has skewed sufficiently to a faster/slower (FS) process corner of the one or more process corners.

10. The integrated circuit of claim 9, wherein the FS process corner refers to faster N-type metal-oxide-semiconductor (NMOS) transistors of the first transistors and to slower P-type MOS (PMOS) transistors of the first transistors.

11. The integrated circuit of claim 1, wherein the memory cells include static random access memory (SRAM) cells, and wherein the memory cell array includes an SRAM cell array.

12. A device, comprising:
- memory circuitry having a plurality of memory cells that are implemented with first transistors of an N-type and a P-type; and
- process sensing circuitry having a process detector that is implemented with second transistors of the N-type and the P-type,
- wherein the second transistors of the process detector are arranged for detecting process variation of the first transistors based at least in part on detecting a process point of the memory cells skewing to a process corner of on one or more process corners.

13. The device of claim 12, wherein the second transistors are fabricated at a same manufacturing time when the first transistors are fabricated.

14. The device of claim 12, wherein the process detector is configured to:
- generate a digital 1-bit output when the second transistors detect process variation of the first transistors; and
- change a write pulse of a write operation associated with at least one memory cell of the memory cells based at least in part on the digital 1-bit output and detecting the process point of the memory cells skewing to the process corner of one or more process corners.

15. The device of claim 12, wherein detecting process variation comprises detecting a process point when the second transistors detect that process variation has skewed sufficiently to a slower/faster (SF) process corner of the one or more process corners.

16. The device of claim 15, wherein the SF process corner refers to slower N-type transistors of the first transistors and to faster P-type transistors of the first transistors.

17. The device of claim 12, wherein detecting process variation comprises detecting a process point when the second transistors detect that process variation has skewed sufficiently to a faster/slower (FS) process corner of the one or more process corners.

18. The device of claim 17, wherein the FS process corner refers to faster N-type transistors of the first transistors and to slower P-type transistors of the first transistors.

19. The device of claim 12, wherein the memory circuitry is implemented with static random access memory (SRAM) circuitry, and wherein the plurality of memory cells include SRAM cells.

20. A method, comprising:
- fabricating memory circuitry with a plurality of memory cells that are implemented with first transistors of complementary types; and
- fabricating process sensing circuitry with a process detector that is implemented with second transistors of the complementary types,
- wherein the second transistors of the process detector are arranged for detecting process variation of the first transistors based at least in part on detecting a process point of the memory cells skewing to a process corner of one or more process corners.

* * * * *